US008193840B2

(12) United States Patent
Cho et al.

(10) Patent No.: US 8,193,840 B2
(45) Date of Patent: Jun. 5, 2012

(54) SYSTEM TIMER AND A MOBILE SYSTEM INCLUDING THE SAME

(75) Inventors: Joon-Woo Cho, Seoul (KR); Eui Cheol Lim, Hwasung-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 209 days.

(21) Appl. No.: 12/698,518

(22) Filed: Feb. 2, 2010

(65) Prior Publication Data

US 2010/0207672 A1 Aug. 19, 2010

(30) Foreign Application Priority Data

Feb. 13, 2009 (KR) ........................ 10-2009-0011842

(51) Int. Cl.
*H03K 21/00* (2006.01)
*H03K 23/00* (2006.01)
*H03K 25/00* (2006.01)

(52) U.S. Cl. ......... 327/115; 327/113; 327/117; 327/149

(58) Field of Classification Search .................. 327/115, 327/116, 117, 118, 355–361, 202, 203, 208–212, 327/218; 377/47, 48
See application file for complete search history.

(56) References Cited

U.S. PATENT DOCUMENTS 3,959,737 A * 5/1976 Tanis ............................ 331/1 A
6,057,719 A * 5/2000 Austin et al. .................. 327/117
2004/0036513 A1* 2/2004 Gibbons ....................... 327/117
2005/0104634 A1* 5/2005 Fujishima ..................... 327/117
2009/0168947 A1* 7/2009 Chiu et al. ...................... 377/47
2009/0237128 A1* 9/2009 Qiao ............................ 327/117

FOREIGN PATENT DOCUMENTS

JP 03-211915 9/1991
JP 2007-189455 7/2007
JP 2007-300486 11/2007
JP 2008-177766 7/2008

* cited by examiner

*Primary Examiner* — Lincoln Donovan
*Assistant Examiner* — Brandon s Cole
(74) *Attorney, Agent, or Firm* — F. Chau & Associates, LLC

(57) ABSTRACT

A system timer including a divider unit configured to fractionally divide a first clock signal and output a second clock signal having an asymmetric duty ratio and an interrupt generation unit configured to count a cycle of the second clock signal and output an interrupt signal according to the count.

14 Claims, 5 Drawing Sheets

100
110
DIVIDER UNIT
120
INTERRUPT GENERATION UNIT
CLK1
CLK2
IS
CL1
CL2
ref1
CL3
ref2

110
CLK1
CLK2
FRACTIONAL DIVIDER
111
RC1
117
ACCUMULATING COMPARATOR
CL2
ref1
113
CS
115
ACCUMULATOR
CNT
CL1
CL1'

SYSTEM TIMER AND A MOBILE SYSTEM INCLUDING THE SAME

CROSS-REFERENCE TO RELATED APPLICATION

This application claims priority under 35 U.S.C. §119 to Korean Patent Application No. 10-2009-0011842, filed on Feb. 13, 2009, in the Korean Intellectual Property Office, the disclosure of which is incorporated by reference herein in its entirety.

BACKGROUND

1. Technical Field

The present inventive concept relates to a system timer and a mobile system including the same, and more particularly, to a system timer including a fractional (number) divider and a mobile system including the same.

2. Discussion of Related Art

Various methods are used to generate a clock signal required by an operating system (OS) in a mobile system. For example, in a method of generating a clock signal, which an OS requires, an oscillator is connected to the outside of a mobile system; however, this may increase the manufacturing cost of the mobile system and make it difficult to reduce the size of the mobile system. Another method utilizes an oscillator already existing inside the mobile system. For example, by using a divider, e.g., an integer divider, capable of dividing a clock signal output from the oscillator, a clock signal, which an OS requires, may be generated.

However, in the second method, when a period of a clock signal output from the integer divider is not a multiple of a cycle of a clock signal input to the integer divider, a clock signal that an OS requires may not be generated. In addition, when dividing a high-speed clock signal used in a mobile system, current consumed in a standby mode of the mobile system may be increased, thereby increasing current consumption of the entire mobile system.

Accordingly, there is a need for a device that generates its own clock signal to stably provide the clock signal to an OS.

SUMMARY

The present inventive concept provides a system timer capable of generating a clock signal having predetermined period that an operating system (OS) requires. The present inventive concept also provides a mobile system including the system timer.

An exemplary embodiment of the present inventive concept provides a system timer, including a divider unit configured to fractionally divide a first clock signal and output a second clock signal having an asymmetric duty ratio, and an interrupt generating unit configured to count a cycle of the second clock signal and output an interrupt signal according to the count.

The divider unit may include a fractional divider configured to count a cycle of the first clock signal according to a first control value and output a fractionally divided first clock signal in response to fractionally dividing the first clock signal according to a count value resulting from counting the cycle of the first clock signal; and a duty ratio adjuster configured to accumulate a second control value according to the fractionally divided first clock signal, compare the accumulated second control value with a first reference value, and output a control signal for adjusting a duty ratio of the fractionally divided first clock signal according to a result of comparing the accumulated second control value with the first reference value.

The first control value, the second control value or the first reference value may be input to the divider unit from a separate device.

The duty ratio adjuster may include an accumulating comparator configured to accumulate the second control value according to the fractionally divided first clock signal, compare the accumulated second control value with the first reference value, and output a comparative signal according to the result of comparing the accumulated second control value with the first reference value; and an accumulator configured to output the control signal for increasing the first control value according to the comparative signal output from the accumulating comparator, wherein the fractional divider increases a cycle of the first clock signal according to the increased first control value, fractionally divides the first clock signal with the increased cycle, and outputs the second clock signal having the asymmetric duty ratio.

The accumulating comparator may output the comparative signal in response to the accumulated second control value being greater than or equal to the first reference value.

The first control value and the second control value may be initialized in response to the second clock signal being output from the divider unit.

The interrupt generating unit may include a counter configured to count the cycle of the second clock signal having the asymmetric duty ratio output from the divider unit and output a count value resulting from counting the cycle of the second clock signal; and a signal generator configured to compare the count value output from the counter with a second reference value and output the interrupt signal according to a result of comparing the count value output from the counter with the second reference value.

The cycle of the second clock signal may be counted according to a third control value.

The second reference value or the third control value may be input to the interrupt generating unit from a separate device.

The signal generator may output the interrupt signal in response to the count value output from the counter being greater than or equal to the second reference value.

The first clock signal may be input to the divider unit from a separate device.

An exemplary embodiment of the present inventive concept provides a mobile system, including an oscillator configured to output a first clock signal, a system timer configured to count a cycle of a second clock signal having an asymmetric duty ratio, which is generated by fractionally dividing the first clock signal and output an interrupt signal; and a processor configured to be interrupted by an interrupt signal and drive an operating system.

The system timer may further include a divider unit configured to fractionally divide the first clock signal and output the second clock signal having the asymmetric duty ratio; and an interrupt generation unit configured count the cycle of the second clock signal for a first time and to output the interrupt signal according to the count.

The divider unit may include a fractional divider configured to count a cycle of the first clock signal according to a first control value and output the fractionally divided first clock signal in response to fractionally dividing the first clock signal according to a count value resulting from counting the cycle of the first clock signal; and a duty ratio adjuster configured to accumulate a second control value according to the fractionally divided first clock signal, compare the accumulated second control value with a first reference value, and output a control signal for adjusting a duty ratio of the fractionally divided first clock signal according to a result of comparing the accumulated second control value with the first reference value.

The duty ratio adjuster may include an accumulating comparator configured to accumulate the second control value according to the fractionally divided first clock signal, compare the accumulated second control value with the first reference value, and output a comparative signal according to the result of comparing the accumulated second control value with the first reference value; and an accumulator configured to output the control signal for increasing the first control value according to the comparative signal output from the accumulating comparator, wherein the fractional divider increases a cycle of the first clock signal according to the increased first control value, fractionally divides the first clock signal with the increased cycle, and outputs the second clock signal having the asymmetric duty ratio.

The accumulating comparator may output the comparative signal in response to the accumulated second control value being greater than or equal to the first reference value.

The first control value and the second control value may be initialized in response to the second clock signal being output from the divider unit.

The interrupt generating unit may include a counter configured to count the cycle of the second clock signal having the asymmetric duty ratio output from the divider unit and output a count value resulting from counting the cycle of the second clock signal; and a signal generator configured to compare the count value output from the counter with a second reference value and output the interrupt signal according to a result of comparing the count value output from the counter with the second reference value.

The signal generator may output the interrupt signal in response to the count value output from the counter being greater than or equal to the second reference value.

BRIEF DESCRIPTION OF THE DRAWINGS

The above and other features of the present inventive concept will become more apparent by describing in detail exemplary embodiments thereof with reference to the accompanying drawings in which.

DETAILED DESCRIPTION OF THE EMBODIMENTS

Figure 1:
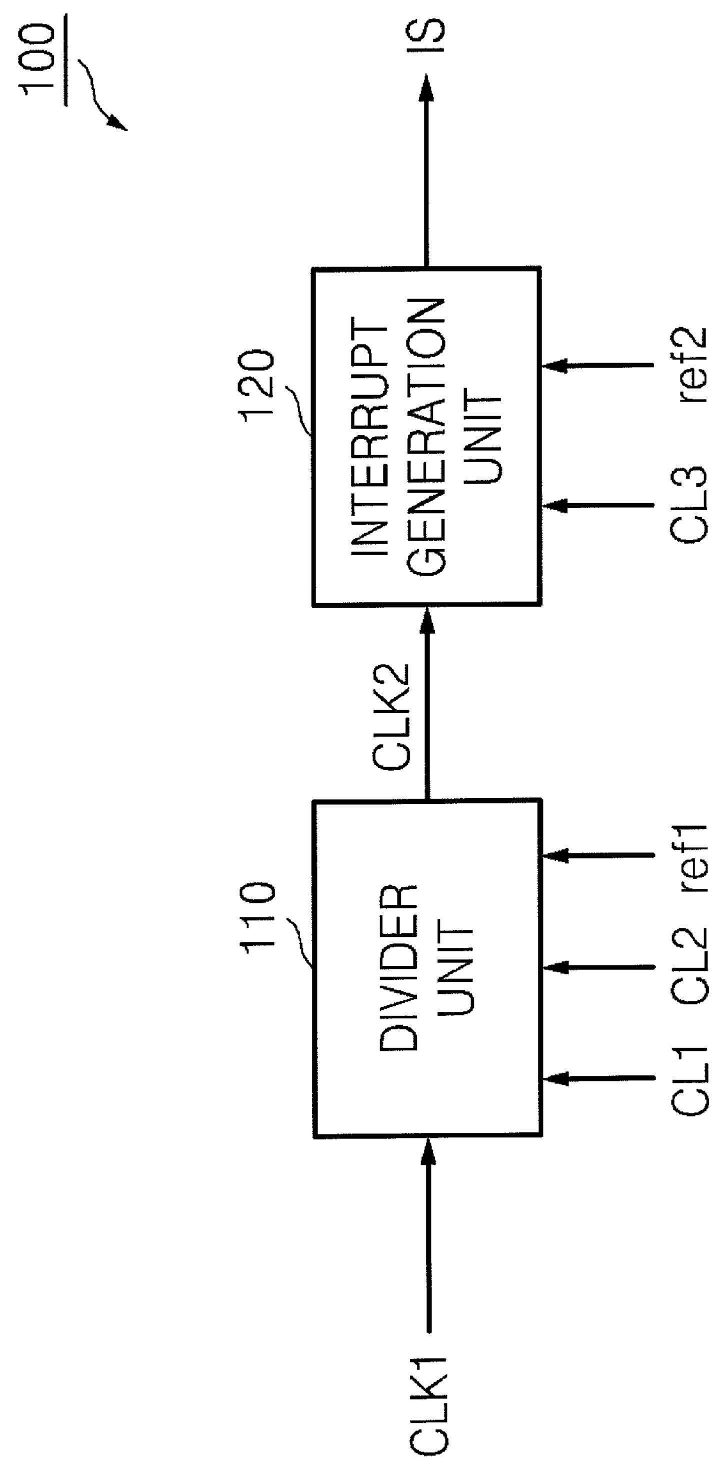
FIG. 1 is a block diagram of a system timer according to an exemplary embodiment of the present inventive concept.

Hereinafter, exemplary embodiments of the present inventive concept will be described more fully with reference to the accompanying drawings, wherein like reference numerals may refer to the like elements. The inventive concept may, however, be embodied in many different forms and should not be construed as limited to the embodiments set forth herein.

Figure 2:
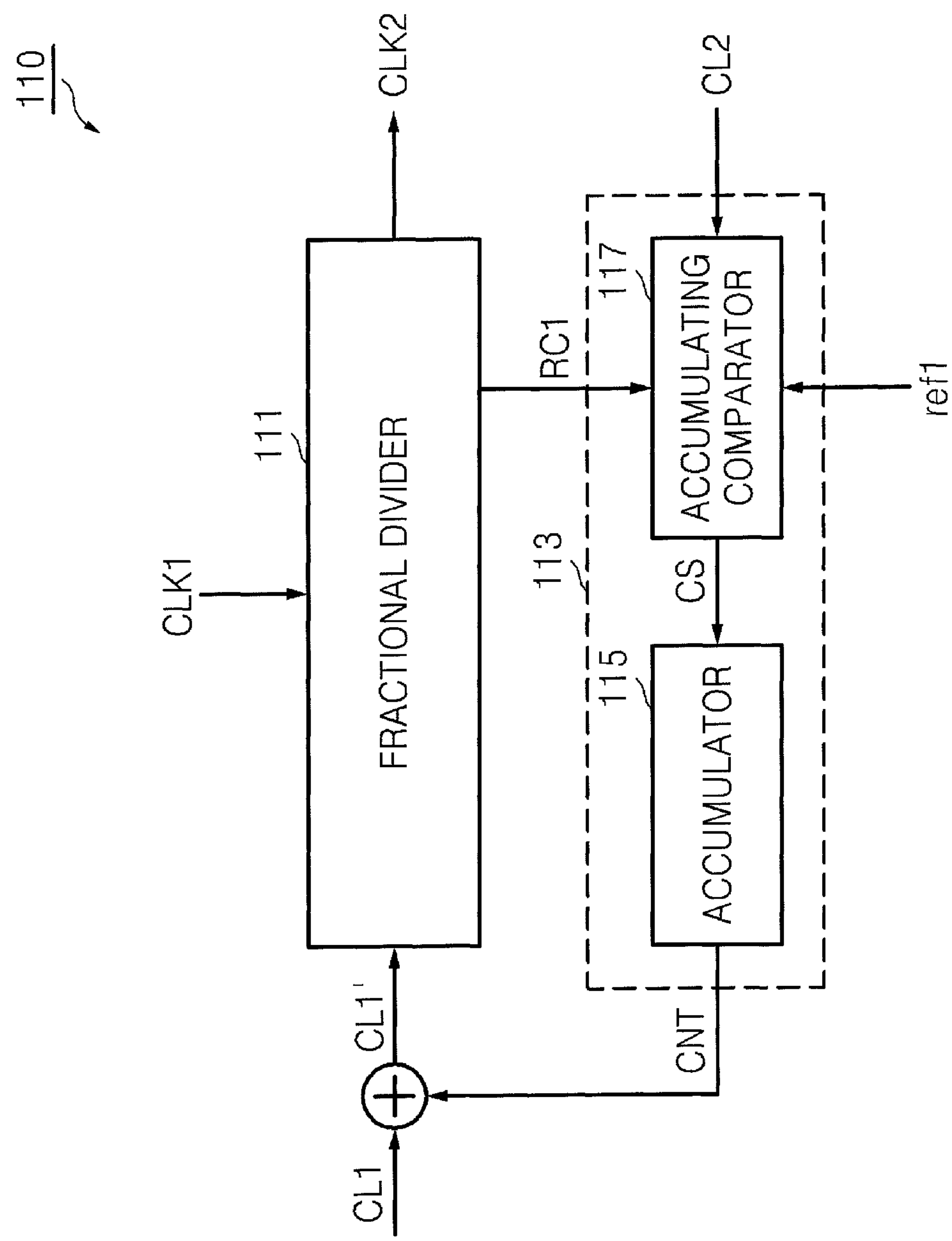
FIG. 2 is a block diagram of a divider unit illustrated in FIG. 1.
Figure 3:
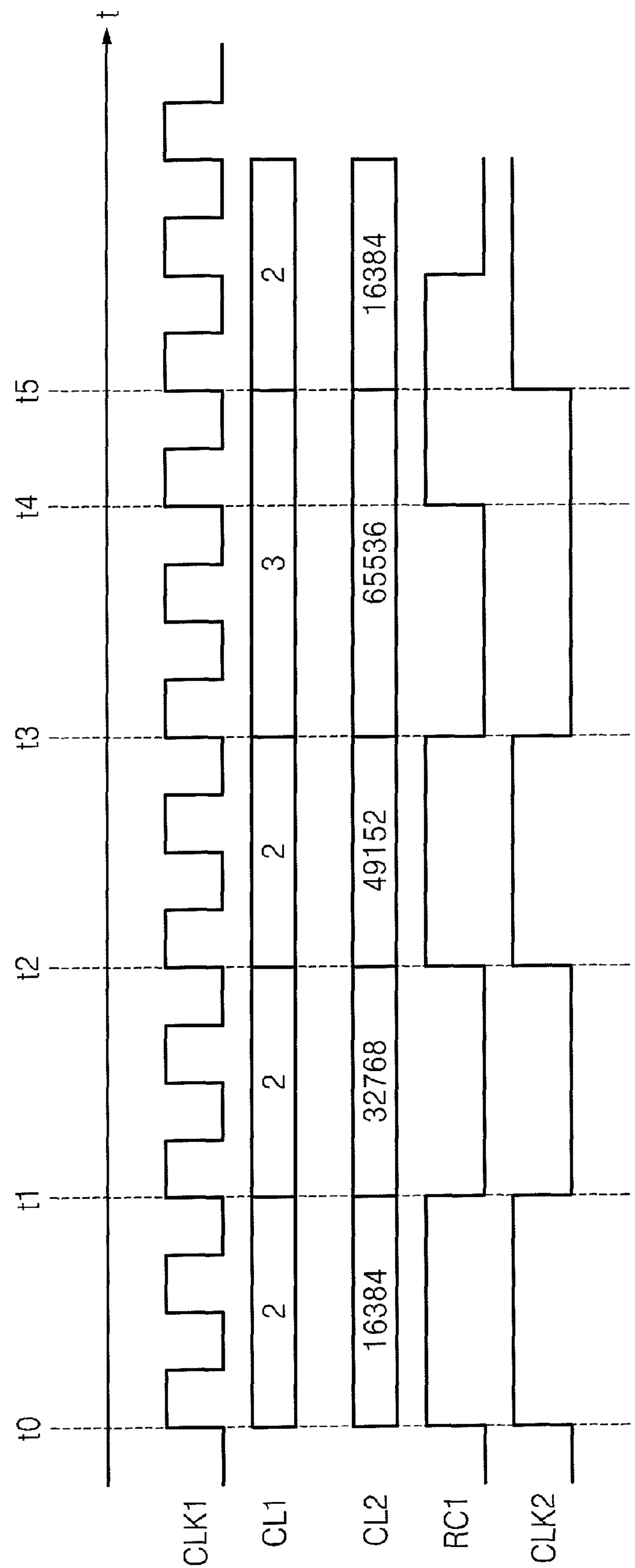
FIG. 3 is a timing diagram of the divider unit illustrated in FIG. 1.
Figure 4:
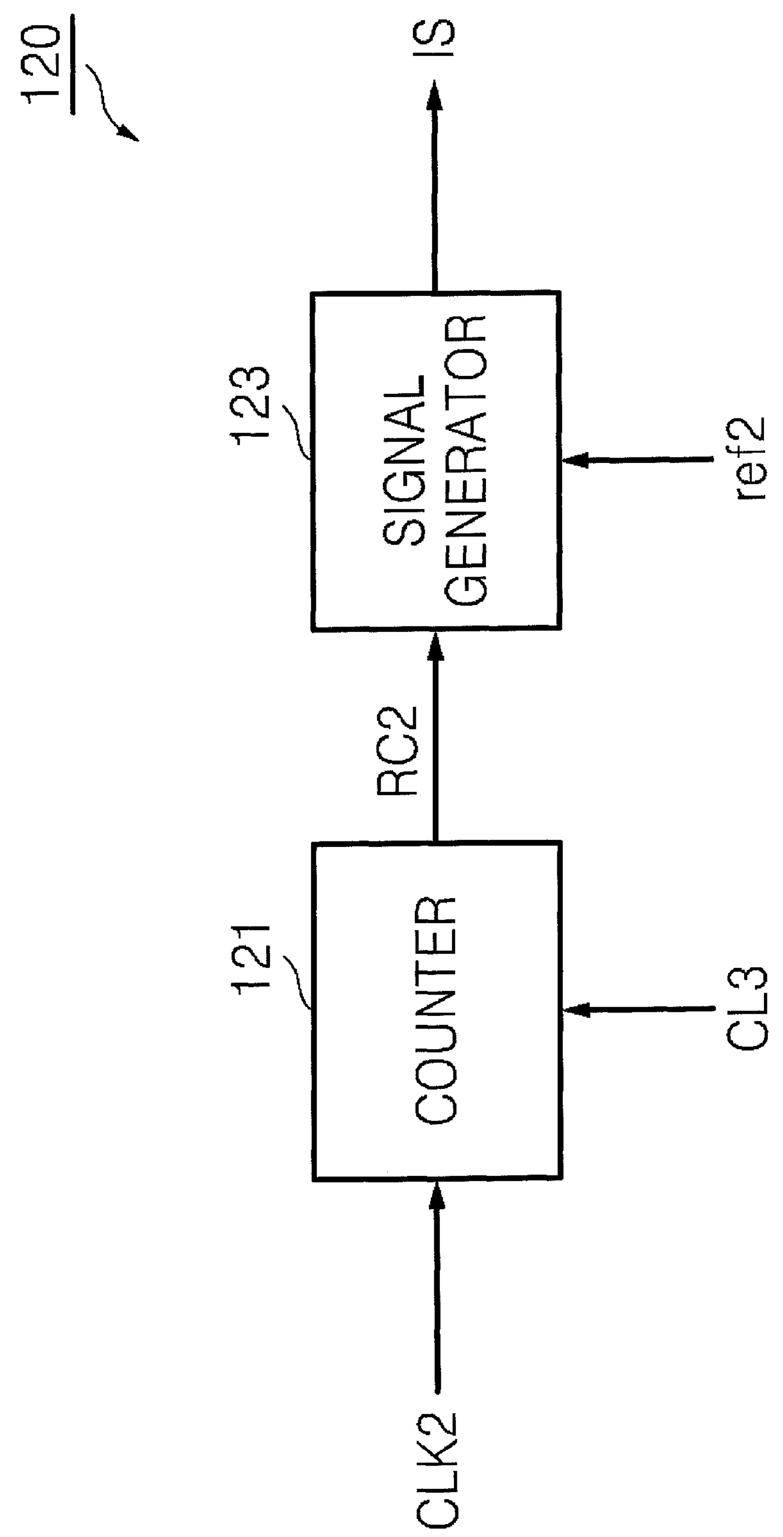
FIG. 4 is a block diagram of an interrupt generation unit illustrated in FIG. 1.

FIG. 1 is a block diagram of a system timer according to an exemplary embodiment of the present inventive concept, FIG. 2 is a block diagram of a divider unit illustrated in FIG. 1, FIG. 3 is a timing diagram of the divider unit illustrated in FIG. 1, and FIG. 4 is a block diagram of an interrupt generation unit illustrated in FIG. 1.

Referring to FIGS. 1, 2, and 4, a system timer 100 of the present inventive concept may include a divider unit 110 and an interrupt generation unit 120.

The divider unit 110 may receive and fractionally divide a clock signal, e.g., a first clock signal CLK1, output from an external oscillator (not shown), and output a clock signal, e.g., a second clock signal CLK2, having an asymmetric duty ratio by adjusting a duty ratio of the fractionally divided first clock signal RC1.

The divider unit 110 may include a fractional divider 111 and a duty ratio adjuster 113. The fractional divider 111 may receive a first clock signal CLK1, fractionally divide it and output a fractionally divided first clock signal RC1.

The fractional divider 111 may receive a control value, e.g., a first control value CL1, input from the outside for fractionally dividing the first clock signal CLK1. The first control value CL1 may be a counting control value for counting a cycle of the first clock signal CLK1, e.g., a frequency of a first level or a second level of the first clock signal CLK1. Here, a first level of the first clock signal CLK1 may mean that the first clock signal CLK1 is at a high level, and a second level of the first clock signal CLK1 may mean that the first clock signal CLK1 is at a low level.

For example, as illustrated in FIG. 3, an exemplary embodiment of the present inventive concept illustrates an exemplary case where a first control value CL1 input to the fractional divider 111 is 2 or 3; however, the present inventive concept is not so restricted.

Referring to FIGS. 2 and 3, the fractional divider 111 may receive a first clock signal CLK1 having a predetermined period during t0 to t5 of a time axis t. In addition, the fractional divider 111 may receive the first control value CL1, e.g., a first control value CL1 for counting a number of cycles of the first clock signal CLK1, e.g., as much as 2 cycles within any two time periods from t0 to t5.

The fractional divider 111 may fractionally divide the first clock signal CLK1 according to the first control value CL1 during t0 to t5 of a time axis t, and output a fractionally divided first clock signal RC1. For example, during t0 to t1 of a time axis t, the fractional divider 111 may count a cycle of the first clock signal CLK1 according to the first control value CL1. Here, the fractional divider 111 may count a rising edge or a falling edge of the first clock signal CLK1 according to the first control value CL1, and count a number of cycles of the first clock signal CLK1, as much as 2 between any time period between t0 to t5.

Accordingly, the fractional divider 111 may output a fractionally divided first clock signal RC1 from the first clock signal CLK1. The fractionally divided first clock signal RC1 may be input to the duty ratio adjuster 113.

The duty ratio adjuster 113 may include an accumulating comparator 117 and an accumulator 115. The accumulating comparator 117 may receive the fractionally divided first clock signal RC1 output from the fractional divider 111 and output a comparative signal CS according to a second control value CL2 and a first reference value ref1, which are input from the outside.

Here, the second control value CL2 input to the accumulating comparator 117 may be a digital bit value $2^N$, where N is a natural number. Exemplary embodiments of the present inventive concept explain a case where N is 14, i.e., the second control value CL2 has a value of 16,384; however, the second control value CL2 is not restricted thereto.

Additionally, the first reference value re1 input to the accumulating comparator 117 may be a digital bit value $2^M$, where M is a natural number. Exemplary embodiments of the present inventive concept explain a case where M is 16, i.e., the first reference value re1 has a value of 65,536; however, the first reference value re1 is not restricted thereto.

The accumulating comparator 117 may accumulate the second control value CL2 according to the fractionally divided first clock signal RC1. The accumulating comparator 117 may also compare the accumulated second control value CL2 with the first reference value ref1 and output a comparative signal CS according to a comparison result. Here, the accumulating comparator 117 may output the comparative signal CS when the accumulated second control value CL2 is greater than or equal to the first reference value ref1.

Referring to FIG. 3, the accumulating comparator 117 may accumulate a second control value CL2 according to a fractionally divided first clock signal RC1 of a first level, e.g., a high level, during time t0 to t1 of a time axis t. The accumulating comparator 117 may compare the accumulated second control value CL2, e.g., an accumulated second control value CL2 having a value of 16,384, with a first reference value ref1, e.g., a first reference value having a value of 65,536. Here, the accumulating comparator 117 may not output a comparative signal CS since the accumulated second control value CL2 is smaller than the first reference value ref1.

The accumulating comparator 117 may accumulate the second control value CL2 according to a fractionally divided first clock signal RC1 of a second level, e.g., a low level, during t1 to t2 of a time axis t.

The accumulating comparator 117 may compare the accumulated second control value CL2, e.g., an accumulated second control value CL2 having a value of 32,768, with the first reference value ref1, e.g., the first reference value ref1 having a value of 65,536. Here, the accumulating comparator 117 may not output a comparative signal CS since the accumulated second control value CL2 is smaller than the first reference value ref1.

The accumulating comparator 117 may accumulate the second control value CL2 according to a fractionally divided first clock signal RC1 of a first level, e.g., a high level, during t2 to t3 of a time axis t. The accumulating comparator 117 may compare the accumulated second control value CL2, e.g., an accumulated second control value CL2 having a value of 49,152, and the first reference value ref1, e.g., the first reference value ref1 having a value of 65,536. Here, the accumulating comparator 117 may not output a comparative signal CS since the accumulated second control value CL2 is smaller than the first reference value ref1.

The accumulating comparator 117 may accumulate the second control value CL2 according to a fractionally divided first clock signal RC1 of a second level, e.g., a low level, during t3 to t4 of a time axis t. The accumulating comparator 117 may compare the accumulated second control value CL2, e.g., a accumulated second control value CL2 having a value of 65,536, with the first reference value ref1, e.g., the first reference value having a value of 65,536. Here, the accumulating comparator 117 may output a comparative signal CS since the accumulated second control value CL2 is equal to the first reference value ref1.

Referring to FIG. 2 again, a comparative signal CS output from an accumulating comparator 117 may be input to the accumulator 115. The accumulator 115 may output a control signal CNT according to an input comparative signal CS, and the control signal CNT may increase a first control value CL1 input to a fractional divider 111.

Referring to FIG. 3, during t3 to t4 of a time axis t, when a comparative signal CS is output from the accumulating comparator 117, the accumulator 115 may output a control signal CNT according to the comparative signal CS. The control signal CNT output from the accumulator 115 may increase a first control value CL1 input to the fractional divider 111 as much as 1. Accordingly, the fractional divider 111 may count a cycle of a first clock signal CLK1 as much as 3 according to an increased first control value CL1'.

Accordingly, a fractionally divided first clock signal RC1 output during t3 to t5 of a time axis t may be extended by a cycle of the first clock signal CLK1 compared to the fractionally divided first clock signal RC1 output during t1 to t2 of a time axis t, and the fractionally divided first clock signal RC1 whose cycle is extended may be output from the fractional divider 111 as a second clock signal CLK2.

In other words, the second clock signal CLK2 output from the fractional divider 111 may be a clock signal having an asymmetric duty ratio during t0 to t5 of a time axis t In other words, the divider unit 110 fractionally divides the input first clock signal CLK1 according to control values CL1 and CL2 input from the outside. Thus, according to an exemplary embodiment of the inventive concept, a cycle of a clock signal that a system requires may be generated by adjusting a duty ratio of a fractionally divided first clock signal RC1 and outputting a second clock signal CLK2 having an asymmetric duty ratio even though a clock signal having a certain cycle is input.

For example, in the timing diagram of FIG. 3, when time t0 to t5 of a time axis t is 1 second, a first clock signal CLK1 input from the outside to the divider unit 110 may be a clock signal having a frequency of 9 Hz. Here, supposing the system requires a clock signal having a frequency of 2 Hz, a clock signal of 2 Hz may not be generated by using a conventional divider.

However, the divider unit 110 according to an exemplary embodiment of the present inventive concept may generate a second clock signal CLK2 having an asymmetric duty ratio by extending a cycle of a fractionally divided first clock signal RC1 during t4 to t5 of a time axis t, and accordingly, it may generate and output a second clock signal CLK2 having a frequency of 2 Hz from the first clock signal having a frequency of 9 Hz during t0 to t5 of a time axis t.

Referring to FIGS. 2 and 3 again, after the fractional divider 111 outputs a second clock signal CLK2 having an asymmetric duty ratio in response to a control signal CNT output from the accumulator 115, a first control value CL1 and a second control value CL2 input from the outside may be initialized. For example, the first control value CL1 input from the outside at t5 of a time axis t may be a first control value CL1 in an initial state, e.g., a first control value CL1 having a value of 2, and a second control value CL2 input from the outside at t5 of a time axis t may be a second control value CL2 in an initial state, i.e., a second control value CL2 having a value of 16,384.

Subsequently, the divider unit 110, beginning after t5 of a time axis t, may perform a fractional dividing operation and a duty ratio adjusting operation of a first clock CLK1 again, similar to that which the divider unit 110 performed during t0 to t5 of a time axis t.

Referring to FIGS. 1 to 4, a second clock signal CLK2 output from the divider unit 110 may be input to an interrupt generation unit 120. The interrupt generation unit 120 may output an interrupt signal IS according to a second clock signal CLK2 output from the divider unit 110, and the interrupt signal IS may be supplied to a control device such as a central processing unit (CPU) (not shown).

The interrupt generation unit 120 may include a counter 121 and a signal generator 123.

The counter 121 may count a cycle of a second clock signal CLK2 according to a third control value CL3 input from the outside. The third control value CL3 may be a counting control value for counting a cycle of the second clock signal CLK2 similar to a first control value CL1 input to the divider unit 110 explained above.

The counter 121 may count a cycle of the second clock signal CLK2 according to the third control value CL3 and output a counting result RC2. The counting result RC2 output from the counter 121 may be a frequency of counting a cycle of the second clock signal CLK2.

The counting result RC2 may be input to the signal generator 123. The signal generator 123 may compare a second reference value ref2 input from the outside with the counting result value RC2, and output an interrupt signal IS according to a comparison result. For example, the signal generator 123 may output an interrupt signal IS when the counting result value RC2 output from the counter 121 is greater than or equal to the second reference value ref2. Here, the second reference value ref2 may be I, where I is a natural number and not 0.

Figure 5:
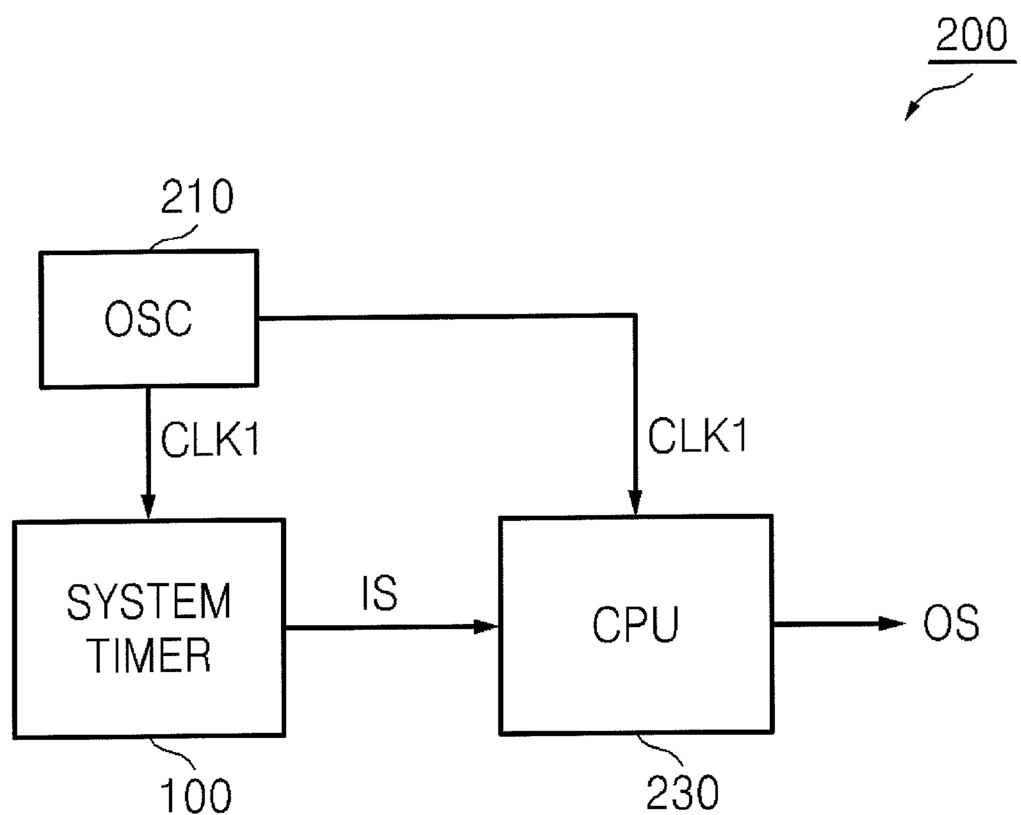
FIG. 5 is a block diagram of a mobile system including the system timer illustrated in FIG. 1.

FIG. 5 is a block diagram of a mobile system including a system timer illustrated in FIG. 1. In an exemplary embodiment of the present inventive concept, a system timer used in a mobile system, e.g., a mobile communication terminal or a personal digital assistant (PDA) and so on, is explained; however, the present inventive concept is not restricted thereto. For example, a system timer according to an exemplary embodiment of the present invention may be used in a computer system, a digital camera system and so on.

Referring to FIG. 5, a mobile system 200 according to an exemplary embodiment of the present inventive concept may include an oscillator OSC 210, a system timer 100, and a CPU 230.

The system timer 100 illustrated in FIG. 5 is similar to a system timer 100 explained above referring to FIGS. 1 to 4, so a detailed explanation thereof is omitted.

The oscillator 210 may output a plurality of clock signals. One first clock signal CLK1 output from the oscillator 210 may be input to the system timer 100, and another first clock signal CLK1 may be input to the CPU 230. Here, the first clock signals CLK1 input to the system timer 100 and the CPU 230 may have the same or different clock cycles.

The system timer 100 may generate and output an interrupt signal IS from a first clock signal CLK1 output from the oscillator 210. The system timer 100 outputs an interrupt signal IS in situations similar to those explained above referring to FIGS. 1 to 4, so a duplicative explanation thereof is omitted. The CPU 230 may be interrupted by the interrupt signal IS output from the system timer 100, and then, drive an operating system (OS).

In a system timer and a mobile system including the system timer according to an exemplary embodiment of the present inventive concept, a clock signal, which an OS requires, may be generated even though a clock signal having a certain cycle is input to the system timer. Accordingly, a manufacturing cost of the mobile system may be reduced and current consumed in a standby mode of the mobile system may be also reduced.

While the present inventive concept has been particularly shown and described with reference to exemplary embodiments thereof, it will be understood by those of ordinary skill in the art that various changes in form and detail may be made to these embodiments without departing from the scope and spirit of the inventive concept as defined in the appended claims.

What is claimed is:

1. A system timer, comprising:

a divider unit configured to fractionally divide a first clock signal and output a second clock signal having an asymmetric duty ratio; and an interrupt generation unit configured to count a cycle of the second clock signal and output an interrupt signal according to the count, wherein the divider unit comprises:

a fractional divider configured to count a cycle of the first clock signal according to a first control value and output a fractionally divided first clock signal in response to fractionally dividing the first clock signal according to a count value resulting from counting the cycle of the first clock signal; and a duty ratio adjuster configured to accumulate a second control value according to the fractionally divided first clock signal compare the accumulated second control value with a first reference value, and output a control signal for adjusting a duty ratio of the fractionally divided first clock signal according to a result of comparing the accumulated second control value with the first reference value, wherein the duty ratio adjuster comprises:

an accumulating comparator configured to accumulate the second control value according to the fractionally divided first clock signal, compare the accumulated second control value with the first reference value, and output a comparative signal according to the result of comparing the accumulated second control value with the first reference value, and an accumulator configured to output the control signal to increase the first control value according to the comparative signal output from the accumulating comparator, wherein the fractional divider increases a cycle of the first clock signal according to the increased first control value, fractionally divides the first clock signal with the increased cycle, and outputs the second clock signal having the asymmetric duty ratio.

2. The system timer of claim 1, wherein the first control value, the second control value or the first reference value is input to the divider unit from a separate device.

3. The system timer of claim 1, wherein the accumulating comparator outputs the comparative signal in response to the accumulated second control value being greater than or equal to the first reference value.

4. The system timer of claim 1, wherein the first control value and the second control value are initialized in response to the second clock signal being output from the divider unit.

5. The system timer of claim 1, wherein the interrupt generating unit comprises:

a counter configured to count the cycle of the second clock signal having the asymmetric duty ratio output from the divider unit and output a count value resulting from counting the cycle of the second clock signal; and a signal generator configured to compare the count value output from the counter with a second reference value and output the interrupt signal according to a result of comparing the count value output from the counter with the second reference value.

6. The system timer of claim 5, wherein the cycle of the second clock signal is counted according to a third control value.

7. The system timer of claim 6, wherein the second reference value or the third control value is input to the interrupt generating unit from a separate device.

8. The system timer of claim 5, wherein the signal generator outputs the interrupt signal in response to the count value output from the counter being greater than or equal to the second reference value.

9. The system timer of claim 1, wherein the first clock signal is input to the divider unit from a separate device.

10. A mobile system, comprising:

an oscillator configured to output a first clock signal;

a system timer configured to count a cycle of a second clock signal having an asymmetric duty ratio generated by fractionally dividing the first clock signal and output an interrupt signal; and a processor configured to be interrupted by the interrupt signal and drive an operating system, wherein the system timer comprises:

a divider unit configured to fractionally divide the first clock signal and output the second clock signal having the asymmetric duty ratio; and an interrupt generation unit configured count the cycle of the second clock signal for a first time and to output the interrupt signal according to the count, wherein the divider unit comprises:

a fractional divider configured to count a cycle of the first clock signal according to a first control value and output the fractionally divided first clock signal in response to fractionally dividing the first clock signal according to a count value resulting from counting cycle of the first clock signal; and a duty ratio adjuster configured to accumulate a second control value according to the fractionally divided first clock signal, compare the accumulated second control value with a first reference value, and output a control signal for adjusting a duly ratio of the fractionally divided first clock signal according to a result of comparing the accumulated second control value with the first reference value, wherein the duty ratio adjuster comprises:

an accumulating comparator configured to accumulate the second control value according to the fractionally divided first clock signal, compare the accumulated second control value with the first reference value, and output a comparative signal according to the result of comparing the accumulated second control value with the first reference value; and an accumulator configured to output the control signal to increase the first control value according to the comparative signal output from the accumulating comparator, wherein the fractional divider increases a cycle of the first clock signal according to the increased first control value fractionally divides the first clock signal with the increased cycle, and outputs the second clock signal having the asymmetric duty ratio.

11. The system timer of claim 10, wherein the accumulating comparator outputs the comparative signal in response to the accumulated second control value being greater than or equal to the first reference value.

12. The system timer of claim 10, wherein the first control value and the second control value are initialized in response to the second clock signal being output from the divider unit.

13. The system timer of claim 10, wherein the interrupt generating unit comprises:

a counter configured to count the cycle of the second clock signal having the asymmetric duty ratio output from the divider unit and output a count value resulting from counting the cycle of the second clock signal; and a signal generator configured to compare the count value output from the counter with a second reference value and output the interrupt signal according to a result of comparing the count value output from the counter with the second reference value.

14. The system timer of claim 13, wherein the signal generator outputs the interrupt signal in response to the count value output from the counter being greater than or equal to the second reference value.

* * * * *